United States Patent [19]
Ueno et al.

[11] Patent Number: 4,459,694
[45] Date of Patent: Jul. 10, 1984

[54] FIELD PROGRAMMABLE DEVICE WITH CIRCUITRY FOR DETECTING POOR INSULATION BETWEEN ADJACENT WORD LINES

[75] Inventors: Kouji Ueno, Kawasaki; Toshitaka Fukushima, Yokohama; Kazumi Koyama, Ikoma, all of Japan

[73] Assignee: Fujitsu Limited, Kawasaki, Japan

[21] Appl. No.: 333,653

[22] Filed: Dec. 23, 1981

[30] Foreign Application Priority Data

Dec. 23, 1980 [JP] Japan ................................ 55-182295

[51] Int. Cl.³ ............................................. G06F 11/22
[52] U.S. Cl. ...................................... 371/21; 365/201
[58] Field of Search ............... 371/8, 10, 21; 365/201; 324/73 R

[56] References Cited
U.S. PATENT DOCUMENTS

| 3,995,215 | 11/1976 | Chu et al. ................. | 371/21 |
| 4,055,802 | 10/1977 | Panousis et al. .......... | 371/21 |
| 4,254,477 | 3/1981 | Hsia et al. ................ | 371/10 |
| 4,301,535 | 11/1981 | McKenny et al. .......... | 371/21 |
| 4,320,507 | 3/1982 | Fukushima et al. ....... | 371/21 |
| 4,389,715 | 6/1983 | Eaton, Jr. et al. ........ | 371/8 |

FOREIGN PATENT DOCUMENTS 963751 7/1964 United Kingdom .

OTHER PUBLICATIONS

Schuster, *IEEE Journal of Solid-State Circuits*, "Multiple Word/Bit Line Redundancy for Semiconductor Memories", vol. SC-13, No. 5, Oct. 1978, pp. 698-703.

*Primary Examiner*—Jerry Smith
*Assistant Examiner*—Gary V. Harkcom
*Attorney, Agent, or Firm*—Staas & Halsey

[57] ABSTRACT

A field programmable device comprises regular word lines, regular bit lines, regular memory cells connected at the intersections of the regular word lines and the regular bit lines, at least one test word line adjacent to one of the regular bit lines, and alternately arranged conducting and nonconducting test memory cells arranged at the intersections of the test bit lines and the regular word lines. According to the invention, for the purpose of determining poor insulation between the word lines, the test bit line and the regular word line are insulated by an insulating layer in each nonconducting test memory cell.

4 Claims, 8 Drawing Figures (a)

(b)

FIELD PROGRAMMABLE DEVICE WITH CIRCUITRY FOR DETECTING POOR INSULATION BETWEEN ADJACENT WORD LINES

BACKGROUND OF THE INVENTION (1) Field of the Invention

The present invention relates to a field programmable device, more particularly to a field programmable device suitable for tests for detecting defective operations thereof. The field programmable devices to which the present invention relates include, for example, a ROM (read-only memory), a PROM (programmable read-only memory) and a FPLA (field programmable logic array).

(2) Description of the Prior Art

A conventional field programmable device comprises a memory cell array. The memory cell array comprises memory cells connected between bit lines and word lines at intersections of the bit lines and the word lines. A write-in operation is effected in the memory cells by a user, after the field programmable device is shipped from the manufacturer to the user, in accordance with the program or data desired by the user. Therefore, when the field programmable device is shipped to the user, the memory cells are in their original state with no writing-in of information. However, it is necessary to test the field programmable device for satisfactory operation before shipment. For this purpose, there are provided test memory cells selectively placed in a conductive or nonconductive state through application of predetermined data signals. The test memory cells are connected between test bit lines and word lines at the intersections thereof. The test memory cells may also be connected between bit lines and test word lines. These test bit lines and test word lines are placed adjacent to the group of bit lines and word lines.

In a prior art test system for testing field programmable devices disclosed in U.S. patent application Ser. No. 95,782, which issued as U.S. Pat. No. 4,320,507 on Mar. 16, 1982 or European Patent Application No. 79302622.0, tests of various functions can be performed as hereinafter described. However, the above-mentioned prior art system cannot perform a test for detecting poor insulation between the word lines. Such poor insulation between adjacent word lines would cause write-in errors when the user writes a pattern of desired information into the field programmable device, even after the manufacturer has written a test pattern of information into the test memory cells without any trouble.

SUMMARY OF THE INVENTION

Therefore, the principal object of the present invention is to provide a field programmable device, having test bit lines, test word lines, and test memory cells, in which a test for detecting poor insulation between adjacent word lines can be performed.

According to the present invention, there is provided a field programmable device comprising: a plurality of regular word lines; a plurality of regular bit lines; a plurality of regular memory cells connected at the intersections of the regular word lines and the regular bit lines; at least one test word line adjacent to one of the regular bit lines; and conducting and nonconducting test memory cells alternately arranged at the intersection of the test bit line and the regular word lines. The nonconducting test memory cells comprise open bits electrically disconnected from the test bit lines even when a write-in voltage is applied to the test bit lines.

Preferably, each of the conducting test memory cells comprises a transistor structure having an emitter region electrically connected to the corresponding bit line, and each of the nonconducting test memory cells is not electrically connected to the corresponding bit line.

BRIEF DESCRIPTION OF THE DRAWINGS

The above object and advantages as well as other features of the present invention will be more apparent from the following description when read in conjunction with the attached drawings, wherein.

DESCRIPTION OF THE PREFERRED EMBODIMENTS

Figure 1:
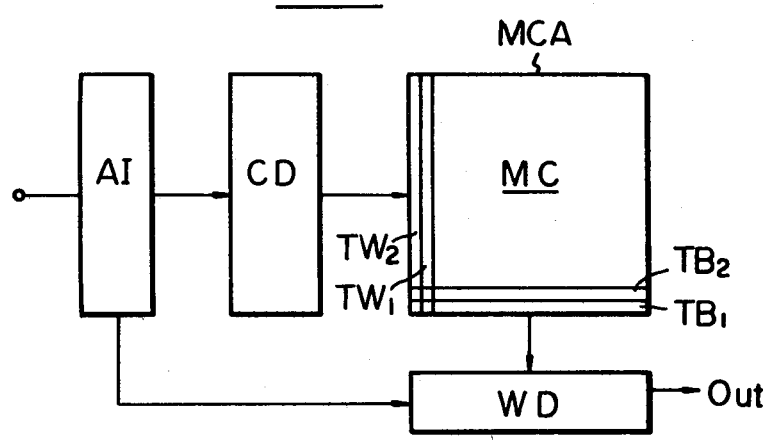
FIG. 1 is a block diagram of a general configuration of a PROM.

Before explaining the embodiments of the present invention, a conventional field programmable device will first be described with reference to FIGS. 1 through 4. FIG. 1 is a block diagram illustrating a general configuration of a PROM. Referring to FIG. 1, the conventional PROM comprises a memory cell array MCA, a column decoder CD, a word decoder WD, and an address inverter AI. The memory cell array MCA comprises, in addition to the usual memory cells MC, two test bit columns $TB_1$ and $TB_2$, and two test word rows $TW_1$ and $TW_2$. The test bit columns $TB_1$ and $TB_2$ are illustrated in detail in FIG. 3. The test bit columns $TB_1$ and $TB_2$ comprise test memory cells. Each test memory cell is formed by, for example, a transistor. Originally, the test memory cells are in their nonconducting states. For the purpose of testing various functions of the PROM before shipment to a user, a test pattern is written into the test memory cells.

Figure 2:
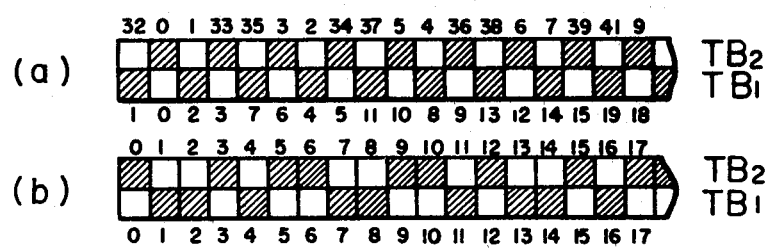
FIG. 2 illustrates an example of a test pattern to be inputted into the PROM of FIG. 1.

FIG. 2 is an example of a test pattern to be written into the test memory cells. In FIG. 2, a blank square represents a data "0" and a slashed square represents a data "1". As illustrated in FIG. 2(b), a test pattern of 011010011001011010... is sequentially inputted into the first test bit column $TB_1$. In the second test bit column $TB_2$, a test pattern inverted from the above test pattern is sequentially inputted. In the actual memory cell array MCA, the arrangements of these test patterns are changed so that, as illustrated in FIG. 2(a), the first test bit column $TB_1$ comprises a test pattern of 101010..., and the second test bit column $TB_2$ comprises a test pattern of 010101.... The numbers above or below the test patterns in FIGS. 2(a) and 2(b) indicate the addresses of the memory cells.

Various tests may be effected before the PROM is shipped from the manufacturer to a user. For example, there are tests to determine whether the memory cells will always output "1" or "0", tests for short-circuits between lines, tests for the current absorbing capability of the decoder driver, tests for the high reference potential of the output voltage, tests for the value of the output current, tests for delay time, and tests to determine whether the decoder operates normally or abnormally. By writing the test pattern of FIG. 2(a) into test memory cells in the test bit columns $TB_1$ and $TB_2$, almost all of the abovementioned tests can be performed, as described in detail in U.S. patent application Ser. No. 95,782, which issued as U.S. Pat. No. 4,320,507 on Mar. 16, 1982, and European Patent Application No. 79302622.0 corresponding to Japanese Patent Application No. 53-145829. However, an insulation test between word lines cannot be performed, as hereinafter described in detail.

Figure 3:
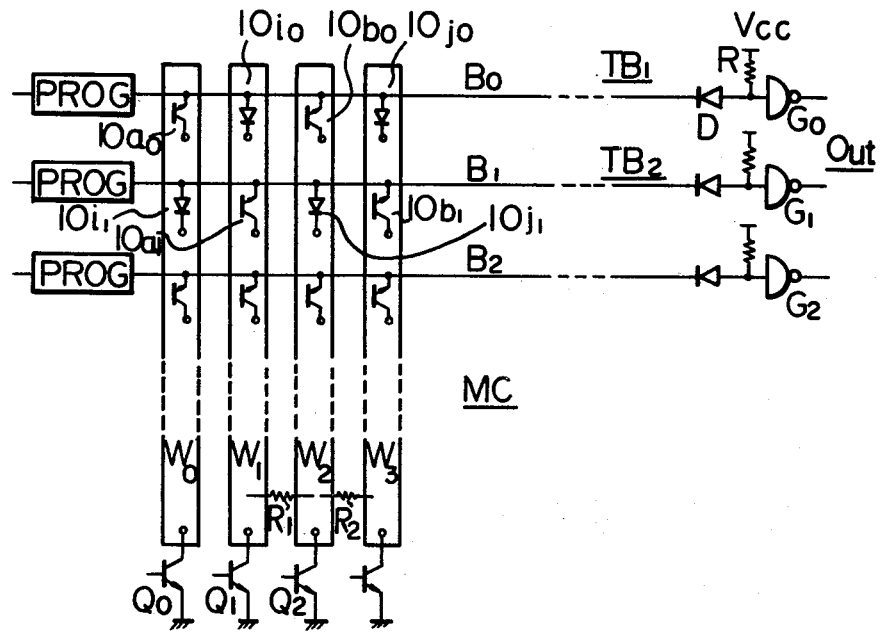
FIG. 3 is a circuit diagram of test memory cells in a PROM.

FIG. 3 is a circuit diagram illustrating test memory cells in a PROM. Referring to FIG. 3, memory cells MC are connected between bit lines $B_0$, $B_1$, $B_2$, . . . and word lines $W_0$, $W_1$, $W_2$, . . . . One end of each bit line is connected to the corresponding output of the column decoder (FIG. 1) which provides a program signal when writing is effected. The other end of each bit line is connected through a diode D and a resistor R to a power supply line $V_{CC}$ for pulling up the bit line. Also, the other end of each bit line is connected through the diode D and a corresponding inverter gate $G_0$, $G_1$, $G_2$, . . . or $G_n$ to readout terminals OUT. The word lines $W_0$, $W_1$, $W_2$, . . . are connected through word-line selection transistors $Q_0$, $Q_1$, $Q_2$, . . . , respectively, to ground. The outputs of the word decoder WD (FIG. 1) are connected to the bases of the corresponding transistors $Q_0$, $Q_1$, $Q_2$, . . . , so that these transistors $Q_0$, $Q_1$, $Q_2$, . . . are turned on or off depending on the outputs of the word decoder WD.

In the example illustrated in FIG. 3, each memory cell is formed by a base-opened npn transistor having an emitter connected to the corresponding bit line and a collector connected to the corresponding word line. Before writing data into the memory cells, the junction between the emitter and the base of each base-opened npn transistor is not broken so that all memory cells are in a nonconducting state. When data is to be written into a memory cell, the word decoder WD provides a high potential output to turn on the corresponding transistor $Q_0$, $Q_1$, or $Q_2$, . . . , and the column decoder CD provides a program signal having a high potential output of about 20 V to the corresponding bit line. In this example, the bit lines $B_0$ and $B_1$ are included in the test bit columns $TB_1$ and $TB_2$, respectively. The test pattern illustrated in FIG. 2(a) is written in the memory cells included in the test bit columns $TB_1$ and $TB_2$. As a result, as illustrated in FIG. 3, the test bit column $TB_1$ comprises alternately arranged nonconducting and conducting memory cells $10_{a0}$, $10_{i0}$, $10_{b0}$, $10_{j0}$, . . . . Also, the test bit column $TB_2$ comprises alternately arranged conducting and nonconducting memory cells $10_{i1}$, $10_{a1}$, $10_{j1}$, $10_{b1}$, . . . . The other memory cells connected between the bit lines $B_2$, $B_3$, . . . and the word lines $W_0$, $W_1$, $W_2$, . . . are used as actual memory cells which are kept in the nonconducting state before the PROM is shipped to the user.

FIG. 4(a) is a plan view of the word line $W_0$ in a conventional PROM. FIGS. 4(b) and 4(c) are cross-sectional views taken along lines X—X and Y—Y, respectively of FIG. 4(a). Referring to FIGS. 4(a) through 4(c), the memory cells $10_{a0}$, $10_{i1}$, . . . are associated with the word line $W_0$; 12 represents a connecting portion between the word line $W_0$ and a buried layer 14; 16 represents isolation regions for electrically isolating adjacent word lines; 18 represents an n-type collector region; 200 and 201 represent p-type base regions formed in the collector region 18; and $E_0$ and $E_1$ represent n-type emitter regions formed in the base regions 200 and 201, respectively. The bit lines $B_0$ and $B_1$ are made in contact with the emitter regions $E_0$ and $E_1$, respectively.

In the writing operation, the column decoder CD (FIG. 1) selects one of the bit lines $B_0$, $B_1$, . . . to apply a write-in voltage of, for example, 20 V, to the selected bit line; and the word decoder selects one of the transistors $Q_0$, $Q_1$, $Q_2$, . . . (FIG. 3) to turn it on. Thus, in the memory cell connected between the selected bit line and the selected word line, a breakdown will occur in the junction between the emitter and the base. For example, when the transistor $10_{i1}$ (FIG. 3), connected between the bit line $B_1$ and the word line $W_0$, is selected so that a write-in operation is effected therein, the junction between the emitter region $E_1$ and the base region 201 of the transistor $10_{i1}$ is broken. As a result, the transistor $10_{i1}$ becomes a diode connected between the bit line $B_1$ and the word line $W_0$ in the forward direction, as illustrated in FIG. 3.

In the reading operation, a power supply voltage $V_{CC}$ of, for example, 5 V, is applied through each resistor R and each diode D to each bit line; and the word decoder selects one of the transistors $Q_0$, $Q_1$, . . . to turn it on. For example, when the transistor $Q_1$ is selected to be turned on, the word line $W_1$ is selected. Then, the bit line $B_0$ becomes a low reference potential because the memory cell $10_{i0}$ is a diode for conducting a current from the bit line $B_0$ to the word line $W_1$. In contrast to the memory cell $10_{i0}$, the memory cell $10_{a1}$ is a transistor with an emitter-base junction which constitutes a diode inserted in reverse polarity in the current path from the bit line $B_1$ to the word line $W_1$. Therefore, the memory cell $10_{a1}$ does not conduct a current from the bit line $B_1$ to the word line $W_1$. Accordingly, the bit line $B_1$ is maintained at the high reference potential. The potentials at the bit lines $B_0$, $B_1$, $B_2$, . . . are inverted by the inverter gates $G_0$, $G_1$, $G_2$, . . . , respectively. The outputs of the inverter gates are the readout data.

The test pattern illustrated in FIG. 2 is written into the memory cells connected to the bit lines $B_0$ and $B_1$ in a similar way as described above. Various tests can be performed by using this test pattern.

However, poor insulation between two adjacent word lines cannot satisfactorily be detected by using the above-mentioned test pattern, because the resistance between two adjacent word lines may be decreased after the PROM is manufactured. If the resistance has been decreased when the manufacturer or the user tries to effect a write-in operation, a write-in error will be caused. This will be explained with reference to FIG. 3.

Assume that the resistance $R_1$ between the adjacent word lines $W_1$ and $W_2$ is decreased to a sufficiently low value. Also, with respect to the test memory cell $MC_1$ connected between the bit line $B_1$ and the word line $W_1$, it is assumed that a write-in operation has been effected by the manufacturer. Then, assume that the user tries to effect a write-in operation regarding the test memory cell $MC_2$ connected between the same bit line $B_1$ and the word line $W_2$ adjacent to the word line $W_1$. In this condition, the memory cell $MC_1$ is a diode. When the transistor $Q_2$ is turned on so that the word line $W_2$ is selected; and when the bit line $B_1$ is selected to be supplied with a write-in voltage of about 20 V, a write-in operation will be effected with respect to the memory cell $MC_2$. However, because the resistance $R_1$ between the word lines $W_1$ and $W_2$ has been decreased, a leakage current flows through the already written test memory cell $MC_1$, which is a diode, the word line $W_1$, the resistance $R_1$, and the transistor $Q_2$ to the ground. As a result, an error occurs in writing data into the memory cell $MC_2$.

Also, if the user tries to effect a write-in operation, a write-in error may be caused. Assume also that the resistance $R_1$ has been decreased to a sufficiently low value; and also assume that, with respect to the memory cell $MC_3$ connected between the bit line $B_2$ and the word line $W_1$, a write-in operation has been effected. Then, assume that the user tries to effect a write-in operation regarding the memory cell $MC_4$ connected between the same bit line $B_2$ and the word line $W_2$ adjacent to the word line $W_1$. Because a leakage current will also flow through the already written memory cell $MC_3$, the word line $W_1$, the resistance $R_1$, and the transistor $Q_2$ to the ground, a write-in error will also occur.

In view of the above-mentioned problems in the prior art, the present invention is provided in which the accidental generation of writing errors due to poor resistance between two adjacent word lines is prevented.

Figure 5:
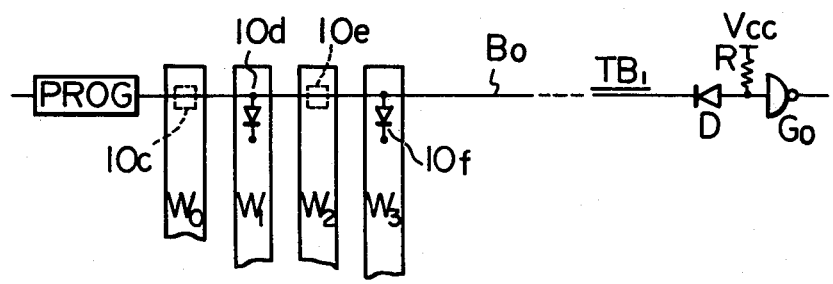
FIG. 5(a) is a main portion of a circuit diagram of test memory cells according to an embodiment of the present invention.
FIG. 5(b) is a cross-sectional view of the structure of two adjacent test memory cells in FIG. 5(a).
Figure 5:
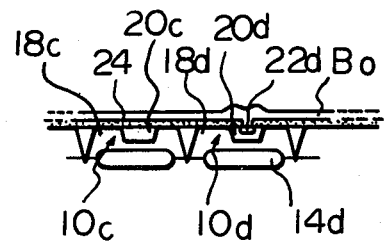

FIG. 5(a) is a main portion of a circuit diagram of test memory cells according to an embodiment of the present invention. In FIG. 5(a), dotted squares $10c$, $10e$, ... represent test memory cells into which write-in operations are not effected. Diodes $10d$, $10f$, ... represent test memory cells into which write-in operations are effected. The other portions are the same as those in the circuit of FIG. 3, and, therefore, are not described here.

FIG. 5(b) is a cross-sectional view of the structure of two adjacent test memory cells $10c$ and $10d$ in FIG. 5(a). Referring to FIG. 5(b), the structure of the written-in test memory cell $10d$ is almost the same as the structure of the test memory cell $10ao$ illustrated in FIG. 4(c). The written-in test memory cell $10d$ comprises an $n^+$-type buried layer $14d$, an n-type collector region $18d$ formed on the buried layer $14d$, a p-type base region $20d$ formed by diffusing acceptor atoms into the collector region $18d$, an n-type emitter region $22d$ formed by diffusing donor atoms into the p-type base region $20d$, an insulating film $24$ covering these regions $18d$, $20d$, and $22d$, and an aluminum evaporated film for the bit line Bo. In the insulating film $24$, a window is opened for contacting the emitter region $20d$ with the aluminum film. In contrast to the written-in memory cell $10d$, the nonwritten memory cell $10c$ has no window in the insulating film $24$. In FIG. 5(b), no emitter region is formed in the base region $20c$ of the memory cell $10c$. Although the base region $20c$ is present in the collector region $10c$, the base region $20c$ is also unnecessary in the nonwritten memory cell $10c$.

By forming the nonwritten memory cells to have a structure as illustrated in FIG. 5(b), even application of a write-in voltage of more than 20 V to the bit line Bo will now cause leakage current flow from the aluminum evaporated film for the bit line Bo through the insulating film $24$ to the collector region $18c$. This is because there is a high insulating resistance and a high tolerance voltage between the bit line Bo and the collector region $18c$ due to the presence of the insulating film $24$ between the bit line Bo and the collector region $18c$.

The above-mentioned non-current leakage characteristic between the test bit line and the collector region connected to the word line in a nonwritten memory cell can be used for testing insulation between two adjacent word lines. Referring back to FIG. 3, assume that the nonwritten test memory cell $10bo$ has the same structure as that of the test memory cell $10c$ illustrated in FIG. 5(b). Even when the memory cell $10bo$ is selected by applying a write-in voltage of about 20 V to the bit line Bo and by turning on the transistor $Q_2$, a current does not flow from the bit line Bo to the word line $W_2$ because the insulating layer $24$ entirely covers the transistor region of the memory cell $10bo$. If a current flowing through the word line $W_2$ is detected, this indicates that poor insulation is present between the word lines $W_1$ and $W_2$ or between the word lines $W_2$ and $W_3$. For example, if there is a resistance $R_1$ between the word lines $W_1$ and $W_2$, a current will flow in the path from the bit line Bo through the written-in memory cell $10io$, the word line $W_1$, the resistance $R_1$, and the word line $W_2$ to the transistor $Q_2$. Similarly, if there is a resistance $R_2$ between the word lines $W_2$ and $W_3$, a current will flow in the path from the bit line Bo through the written-in memory cell $10jo$, the word line $W_3$, the resistance $R_2$, and the word line $W_2$ to the transistor $Q_2$. By detecting this leakage current flowing through the resistance $R_1$ or $R_2$, the value of the resistance $R_1$ or $R_2$ can be determined. If the value of the resistance between the two adjacent word lines is smaller than a predetermined limiting value, the insulation between the adjacent two word lines is determined to be unacceptably poor insulation.

Figure 4:
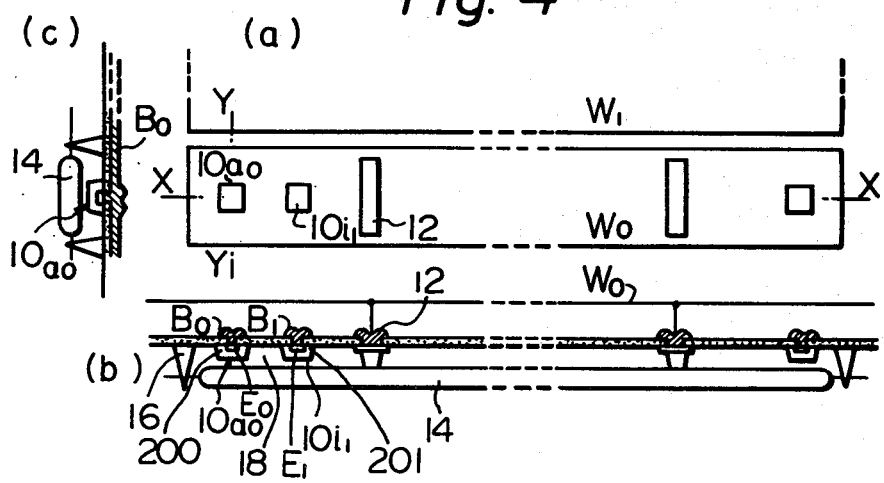
FIG. 4(a) is a plan view of a word line in a conventional PROM.
FIG. 4(b) is a cross-sectional view taken along a line X—X in FIG. 4(a)
FIG. 4(c) is a cross-sectional view taken along a line Y—Y in FIG. 4(a)

In the PROM, a number of wide-width word lines extend in parallel with a small gap between them, as illustrated partially in FIG. 4. Therefore, the possibility of poor insulation between adjacent word lines is relatively high. As described above, such poor insulation can be reliably determined by forming nonwritten memory cells in a test bit column as memory cells not connected to the bit line. While it is preferable to form nonwritten test memory cells which are not connected to respective bit lines, the present invention is not restricted to this: the test bit columns do not have to comprise nonwritten test memory cells, i.e., the nonwritten test memory cells do not have to be formed in the manufacturing step.

In this specification, in a usual memory cell array excluding the test bit columns, nonwritten memory cells are referred to as "transistor bits" and written-in memory cells are referred to as "diode bits". The poor insulation between adjacent word lines may be determined in a reading operation. However, because the readout voltage applied to the bit line is sufficiently lower than the write-in voltage, the leakage current flowing between the adjacent word lines is negligible. Also, a small amount of leakage current will flow through the transistor bits. If a high voltage nearly equal to the write-in voltage is applied to the bit lines, poor insulation may be determined by using the transistor bits and the diode bits. But, in this case, emitter-base breakdown in the transistor bits changes them to diode bits. Therefore, poor insulation between adjacent word lines cannot reliably be determined by using the transistor bits in a reading operation.

From the foregoing description, it will be apparent that, according to the present invention, a resistance between two adjacent word lines can be determined by providing a simple means in which nonwritten memory cells in test bit columns are made as open bits. As a result, in a field programmable device, write-in errors are decreased.

The present invention is not restricted to a PROM but may be applied to other field programmable devices, such as a ROM or FPLA.

We claim:

1. A field programmable device comprising:
   a semiconductor substrate;
   a plurality of word lines, each of said word lines comprising a semiconductor layer of a first conductivity type formed on said semiconductor substrate, said word lines being isolated from each other;
   an insulating layer formed on said semiconductor layer and having a plurality of windows formed therein;
   a plurality of regular memory cells, each of which has a first impurity region of a second conductivity type, opposite to said first conductivity type, formed in said semiconductor layer, and a second impurity region, of said first conductivity type, formed in said first impurity region;
   a plurality of regular bit lines intersecting said plurality of word lines, each of said regular bit lines comprising a conductive layer formed on said insulating layer, said conductive layers contacting said second impurity regions of said regular memory cells through said windows;
   at least one test bit line positioned adjacent to one of said plurality of regular bit lines and intersecting said plurality of word lines, said at least one test bit line comprising a test conductive layer formed on said insulating layer; and
   a plurality of test memory cells respectively formed at the intersections of said at least one test bit line and said plurality of word lines, said plurality of test memory cells including first test memory cells and second test memory cells which are formed at alternating intersections, each of said first test memory cells having a first impurity region of said second conductivity type formed in said semiconductor layer, and a second impurity region of said first conductivity type formed in said first impurity region, each of said second test memory cells including a first impurity region of said second conductivity type formed in said semiconductor layer, said test bit line being in contact with said second impurity regions of said first test memory cells through said windows in said insulating layer, so that said second impurity regions of said first test memory cells are in contact with said at least one test bit line to form conducting test memory cells, said second test memory cells being electrically insulated from said at least one test bit line by said insulating layer, so that said second test memory cells form non-conducting test memory cells.

2. A field programmable device as set forth in claim 1, wherein each of said conducting test memory cells comprises a transistor structure, and wherein said second impurity region of each of said conducting test memory cells comprises an emitter region electrically connected to said at least one test bit line.

3. A field programmable device as set forth in claim 2, wherein each of said conducting test memory cells and said non-conducting test memory cells includes a collector region electrically connected to a corresponding one of said word lines.

4. A field programmable device as set forth in claim 1, wherein each of said conducting test memory cells comprises a diode structure having an anode region electrically connected to said at least one test bit line.

* * * * *